US007015133B2

(12) United States Patent
Su et al.

(10) Patent No.: US 7,015,133 B2
(45) Date of Patent: Mar. 21, 2006

(54) DUAL DAMASCENE STRUCTURE FORMED OF LOW-K DIELECTRIC MATERIALS

(75) Inventors: Yi-Nien Su, Kaohsiung (TW); Jyu-Horng Shieh, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 1 day.

(21) Appl. No.: 10/824,132

(22) Filed: Apr. 14, 2004

(65) Prior Publication Data

US 2005/0233572 A1  Oct. 20, 2005

(51) Int. Cl.
*H01L 21/4763* (2006.01)
(52) U.S. Cl. ............... 438/618; 438/622; 438/680; 438/624; 438/637; 438/634; 438/638; 438/708; 438/672; 438/675; 438/626; 438/636
(58) Field of Classification Search ............... 438/618, 438/622, 680, 624, 637, 634, 638, 708, 672, 438/675, 626, 636
See application file for complete search history.

(56) References Cited

U.S. PATENT DOCUMENTS

| | | | |
|---|---|---|---|
| 6,514,844 B1 * | 2/2003 | Martin et al. ............... | 438/597 |
| 6,521,524 B1 | 2/2003 | Wang et al. | |
| 6,594,540 B1 * | 7/2003 | Parikh ........................ | 700/121 |
| 6,638,849 B1 | 10/2003 | Ting et al. | |
| 6,696,222 B1 * | 2/2004 | Hsue et al. .................. | 430/313 |
| 6,730,573 B1 * | 5/2004 | Ng et al. ..................... | 438/381 |
| 6,858,153 B1 * | 2/2005 | Bjorkman et al. ............ | 216/72 |
| 2002/0155695 A1 * | 10/2002 | Lee et al. .................... | 438/622 |

OTHER PUBLICATIONS

A. Kajita, et al., Highly Reliable Cu/low-k Dual Damascene Interconnect Technology with Hybrid (PAE/SiOC) Dielectrics for 65 nm-node High Performance eDRAM, Proceedings of the IEEE 2003 International Interconnect Technology Conference, Jun. 2003.

* cited by examiner

*Primary Examiner*—David Zarneke
*Assistant Examiner*—Victor V. Yevsikov
(74) *Attorney, Agent, or Firm*—Duane Morris LLP

(57) ABSTRACT

A method for forming a dual damascene interconnect structure provides an intermetal dielectric that includes a spin-on low-k dielectric material formed over a CVD low-k dielectric material. A via opening is formed by etching through the spin-on low-k dielectric material and the CVD low-k dielectric material and a plug material is introduced to fill the via opening. A highly selective trench etching operation etches a trench in the upper, spin-on low-k dielectric material and removes the plug material from the via without attacking the lower CVD low-k dielectric material to form the dual damascene opening which is then filled with a conductive interconnect material. The intermetal dielectric formed of multiple low-k dielectric layers provides advantageous electrical and mechanical properties.

20 Claims, 7 Drawing Sheets

DUAL DAMASCENE STRUCTURE FORMED OF LOW-K DIELECTRIC MATERIALS

FIELD OF THE INVENTION

The present invention relates, most generally, to semiconductor devices and methods for forming the same. More particularly, the present invention relates to a dual damascene interconnect structure formed in a dielectric layer consisting of multiple low-k dielectric materials.

BACKGROUND OF THE INVENTION

The trend in the semiconductor manufacturing industry is to use copper metal as interconnect material in so-called damascene or dual damascene processes. Damascene is an interconnection fabrication process in which grooves or trenches are formed in an insulating layer and then filled with metal to form the conductive lines that interconnect the component parts of an integrated circuit. Dual damascene is a multi-level interconnect process in which via openings are formed in addition to forming the trenches of the single damascene process. A two-tiered opening is formed at locations where the vias extend downward from the groove or trench. Interconnect lines are then formed by introducing conductive material into the dual damascene openings. These conductive lines interconnect active and passive elements of the integrated circuit formed on the semiconductor substrate.

Another trend in the semiconductor manufacturing industry is the use of low-k dielectric materials, particularly as inter-metal dielectrics (IMDs). A low-k dielectric material is defined as a dielectric material having a dielectric constant, k, less than that of $SiO_2$, which has a dielectric constant of about 4. There are generally two types of low-k dielectric materials for semiconductor fabrication processes: modified $SiO_2$ materials; and, organic materials such as polyimides and other polymers. Low-k dielectric materials include such commercial products as Dow Corning's SiLK™ and porous SiLK™, Applied Materials' Black Diamond™, Texas Instruments' Coral™ and other organic polymers, porous oxides and carbon-doped oxides. The electrical characteristics of low-k dielectric materials generally make them desirable in the manufacture of semiconductor chips having sub-micron features because the capacitive effects between closely-spaced electrical conductors is diminished. Such conductors include, for example, dual damascene-formed copper conductors used to make back-end-of-line (BEOL) multilevel electrical connections to silicon devices such as transistors. Therefore, in one particular application of interest, low-k dielectric materials may be used to insulate sub-micron, dual damascene copper interconnects from one another.

When a single low-k dielectric material is used as the IMD in which a two-tiered, dual-damascene opening is to be formed, however, it is difficult to accurately terminate the etch process used to form the upper portion of the dual-damascene opening called the groove or trench. The trench etching process must be terminated based on etching time. If the trench etching process is terminated too early or the IMD layer is too thick, a short upper portion and a via with an undesirably high aspect ratio may result. If the trench etching process is terminated too late or the IMD layer is too thick, the trench may extend through the entire dielectric layer obliterating the via and producing a single damascene structure. As such, non-uniformities of the IMD low-k dielectric material as well as non-uniformities of the etching process itself, render it difficult to form correctly proportioned dual-damascene openings across the substrate without an endpointing system that is available to accurately terminate the etching process based on a physical or chemical change.

Furthermore, each particular low-k dielectric material typically provides a particularly advantageous electrical transport or mechanical quality, often to the exclusion of another. For example, low-k dielectric materials formed using CVD (chemical vapor deposition) such as commonly used to form modified $SiO_2$ low-k dielectric materials, generally provide good mechanical characteristics but somewhat less-than-optimum electrical characteristics. Conversely, low-k dielectric materials formed using a spin-on process, such as organic low-k dielectric materials, typically provide superior electrical transport properties at the expense of strong mechanical properties.

It would therefore be desirable to provide a dual-damascene structure formed in an intermetal dielectric layer that incorporates both the desirable mechanical properties and electrical transport properties available in various low-k materials. It would further be desirable to form the dual damascene structure using a process that can be reliably endpointed to produce an accurately proportioned dual-damascene structure uniformly throughout the semiconductor devices being fabricated on the substrate.

SUMMARY OF THE INVENTION

To achieve these and other objects, and in view of its purposes, the present invention addresses the shortcomings of conventional dual-damascene technologies and provides a method for forming a dual-damascene interconnect structure. The method includes forming a first dielectric layer over a conductive layer using chemical vapor deposition, forming a second dielectric layer over the first dielectric layer by spin coating, and via etching the second dielectric layer and first dielectric layer to form a via opening that extends through the second dielectric layer and the first dielectric layer. The method further includes filling the via opening with a plug material and trench etching the second dielectric layer and plug material to form a trench over a lower portion of the original via opening without substantially attacking the first dielectric layer The trench etching operation also removes the plug material from the via opening, thereby forming a dual-damascene opening.

BRIEF DESCRIPTION OF THE DRAWING

The present invention is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing. Included in the drawing are the following figures, each of which is a cross-sectional view.

DETAILED DESCRIPTION

Figure 1A:
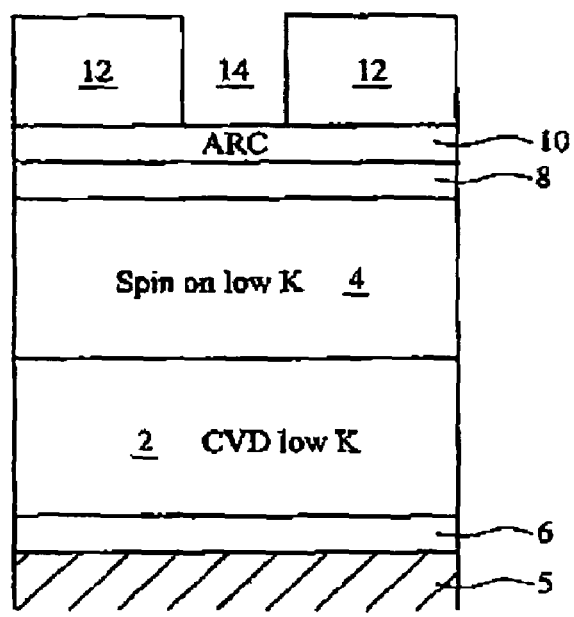
FIGS. 1A–1G show an exemplary process sequence for forming a dual-damascene opening in low-k dielectric materials according to the present invention.

FIGS. 1A–1G are cross-sectional views showing a process sequence for forming a dual-damascene opening according to an exemplary embodiment of the invention. FIG. 1A shows first dielectric layer 2 formed over conductive layer 5. More particularly, first dielectric layer 2 is formed on etch stop layer 6 which is formed on conductive layer 5. Second dielectric layer 4 is formed over first dielectric layer 2, cap layer 8 is formed over second dielectric layer 4 and ARC (antireflective coating) 10 is formed over cap layer 8 in the illustrated embodiment. Patterned photoresist layer 12 includes opening 14 which defines a via opening. Conductive layer 5 may be a suitable conductive material used in the semiconductor industry such as copper, aluminum, aluminum silicon, aluminum copper silicon, and various other copper and aluminum alloys. Optional etch stop layer 6 is used to prevent the dielectric etching process from penetrating into conductive layer 5 and may be formed of SiC, SiN, SiCN, SiOC, or SiON in various embodiments. Other suitable materials may be used in other exemplary embodiments.

First dielectric layer 2 is advantageously formed by chemical vapor deposition (CVD) and will advantageously be a low-k dielectric material. Various known CVD techniques may be used. In one exemplary embodiment, first dielectric layer 2 may be HBD (Hard Black Diamond™) with a dielectric constant, k, within the range of 2.5 to 3. In another exemplary embodiment, CVD first dielectric layer 2 may be an oxide such as PEOX (plasma enhanced oxide) or FSG (fluorinated silicate glass) with a dielectric constant of about 3. In another exemplary embodiment, CVD first dielectric layer 2 may be an ultra low-k dielectric, i.e., a dielectric material having a dielectric constant below 2.5.

Second dielectric layer 4 is formed by spin-coating. Second dielectric layer 4 is advantageously a low-k material. Various low-k materials such as SiLK™ having a dielectric content of about 2.6, and porous SiLK™ having a dielectric constant of about 2.2 or less may be used. Other low-k organic polymer and other materials may be used as second dielectric layer 4 in other exemplary embodiments. Various suitable coating techniques may be used to form second dielectric layer 4 over first dielectric layer 2. The thicknesses of the first dielectric layer 2 and second dielectric layer 4 may vary and will be chosen to produce a dual damascene trench/via opening having the appropriate dimensions as will be illustrated in subsequent figures.

Cap layer 8 is formed over second dielectric layer 4 and may serve as a hardmask for subsequent etch processing. Cap layer 8 may also serve as a polish stop layer for subsequent polishing operations such as CMP (chemical mechanical polishing) and cap layer 8 advantageously prevents moisture from the environment from being absorbed into the low-k dielectric film stack of first dielectric layer 2 and second dielectric layer 4. Cap layer 8 may be formed of various materials such as SiC, SiN, SiCN, SiOC, or SiON but various other materials may be used in other exemplary embodiments. Antireflective coating 10 is optionally formed over cap layer 8 and may be an organic polymer in an exemplary embodiment. In other exemplary embodiments, antireflective coating 10 may not be used. Conventional photoresist and photoresist patterning methods may be used to form patterned photoresist layer 12 including opening 14.

Figure 1B:
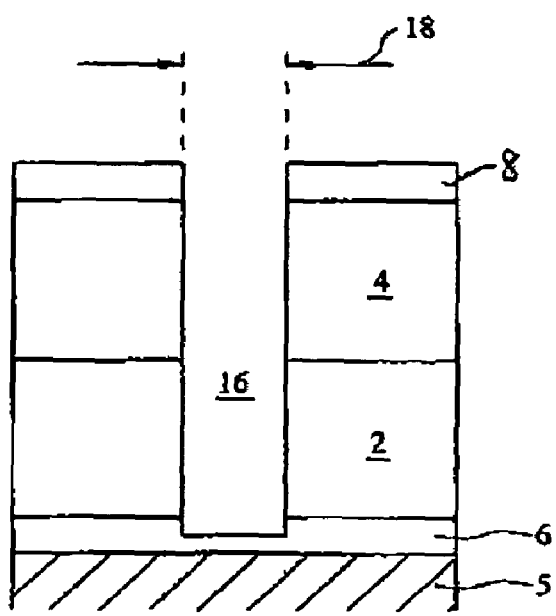

A via etch process is carried out to form via opening 16 such as shown in FIG. 1B. Various via etch process conditions may be used to etch via opening 16 which extends through antireflective coating 10, cap layer 8, second dielectric layer 4 and first dielectric layer 2 to form an organic polymer in an exemplary embodiment. In an exemplary embodiment, the via etch process may be a sequence of etching operations. In the first etching step directed at etching antireflective coating 10 and hardmask, i.e. cap layer 8, etch gases may include some or all of $CF_4$, $CHF_3$, $O_2$, $N_2$, and Ar in various combinations. The main etching step used for etching through second dielectric layer 4 and first dielectric layer 2 may include some or all of $C_4F_8$, $C_5F_8$, $C_4F_6$, $N_2$, $O_2$ and Ar in various combinations. The etch pressure may range from 10–250 millitor and the etch power from 100 to 3000 watts depending on the particular etching tool used and the particulars of the films being etched. Various etching tools may be used. FIG. 1B shows the structure after the photoresist layer and antireflective coating 10 shown in FIG. 1A, have been removed following the via etch process. In another exemplary embodiment, antireflective coating 10 shown in FIG. 1A, may be allowed to remain on the structure when plug material is subsequently introduced.

Figure 1C:
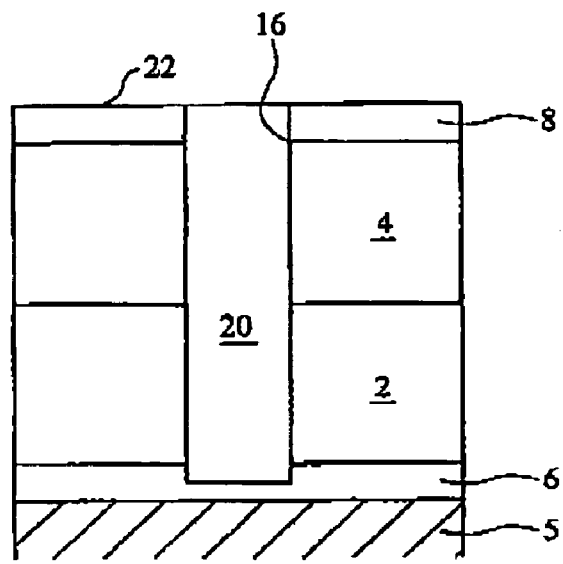
Figure 1D:
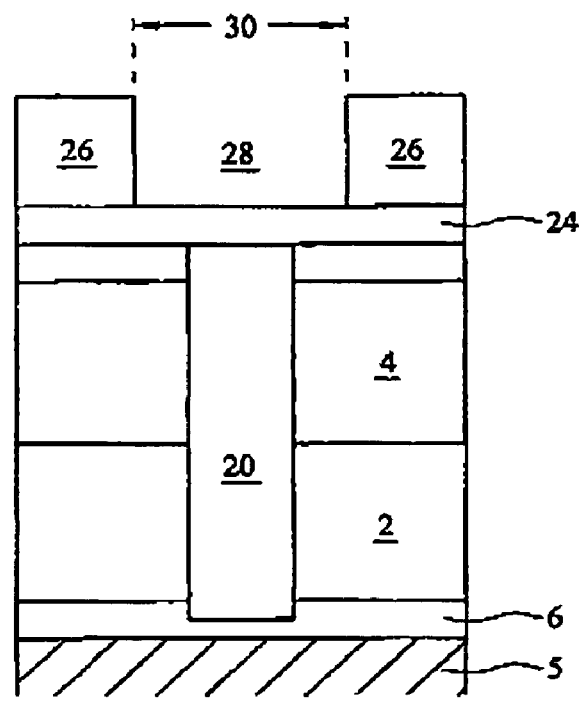

FIG. 1C shows plug material 20 filling via opening 16. Various suitable techniques may be used to introduce plug material 20 into via 16 and over second dielectric layer 4. After plug material 20 is introduced as such, a polishing or etch back process may be used to remove the plug material from over cap layer 8 and produce planar upper surface 22 with plug material 20 disposed only in via opening 16, which it fills. In one exemplary embodiment, plug material 20 may be a photoresist and in another exemplary embodiment plug material 20 may be a spin-on low-k dielectric material. In one particular exemplary embodiment, plug material 20 may be a spin-on low-k dielectric material that is the same material as second dielectric layer 4. FIG. 1D shows the structure in FIG. 1C after optional antireflective coating 24 has been formed over planar upper surface 22 and patterned photoresist layer 26 has been formed over antireflective coating 24. In another exemplary embodiment in which original antireflective coating 10 had not been removed, it may additionally serve as the antireflective coating at this stage. Opening 28 is formed within patterned photoresist layer 26 and aligned over via opening 16 which is filled with plug material 20. Opening 28 of patterned photoresist 26 defines a trench opening and includes width 30 which is greater than width 18 of via opening 16, shown in FIG. 1B.

Figure 1E:
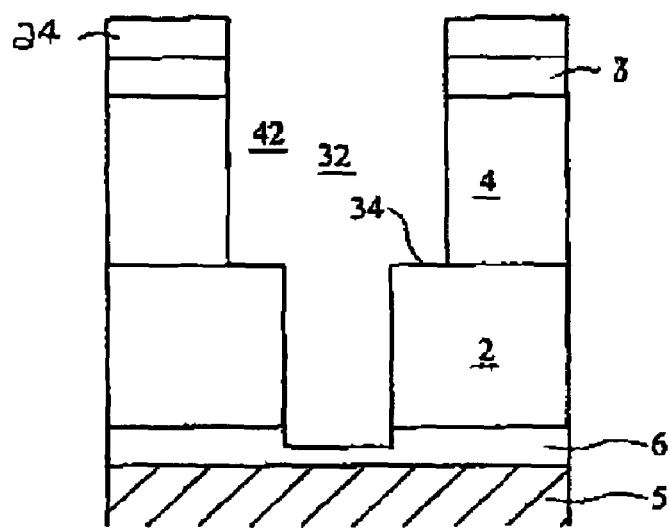

A highly selective trench etching process is then carried out to form the dual-damascene structure in FIG. 1E. The trench etching process is chosen to selectively etch spin-on low-k second dielectric layer 4 and plug material 20, including portions from within the via opening 16 section of first dielectric layer 2, but the trench etching does not substantially attack CVD, low-k first dielectric layer 2. The trench etching process also etches through antireflective coating 24 and portions of cap layer 8 to form dual-damascene opening 32 which is a two-tiered opening that includes terraces 34. The first step of the trench etching process sequence may include some or all of etch gases $CF_4$, $CHF_3$, $O_2$, $N_2$, and Ar in various combinations to etch antireflective coating 24 and cap layer 8. In one exemplary embodiment, an etch process that includes $O_2$, $N_2$, and/or $H_2$ may be used to selectively etch spin-on low-k second dielectric layer 4 and plug material 20 without substantially etching CVD, low-k first dielectric layer 2. The selective trench etching process may include a pressure ranging from 10–250 millitor, and a power ranging from 100–2000 watts. In other exemplary embodiments, other etching conditions may be used and the etching conditions will depend upon the particular spin-on low-k dielectric material and plug material being etched as well as the etching tool used. Various etching tools may be used. The trench etching process may be designed to include a second dielectric layer:first dielectric layer etch selectivity of 20:1 or greater. At least some of etch stop layer 6 remains to prevent the attack of subjacent conductive layer 5 and the resultant dual damascene structure 32 includes trench portion 42 disposed over the lower portion of original via opening 16.

Figure 1F:
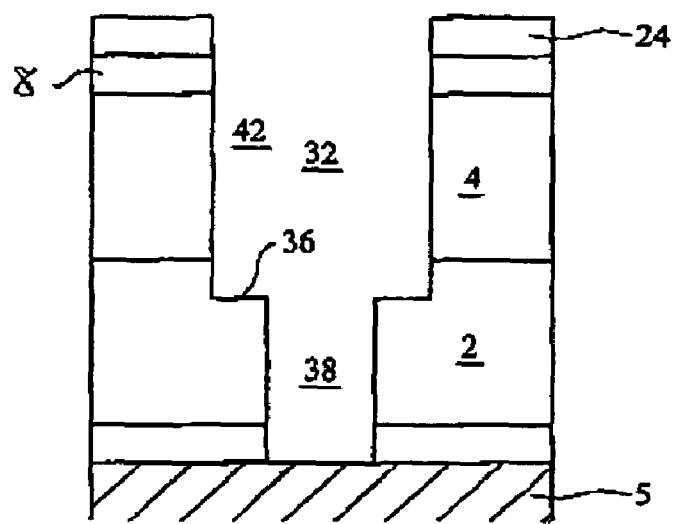

FIG. 1F shows the structure after a liner removal etch has been used to etch exposed portions of etch stop layer 6 and expose subjacent conductive layer 5. The liner removal etch also recedes the terraces to some degree to produce receded terraces 36. The liner removal etch may include some or all of etch gases $CF_4$ $CHF_3$, $N_2$, $H_2$, $O_2$ in various combinations and may include a pressure ranging from 10–250 millitor and a power ranging from 100–2,000 watts. The preceding etch parameters are exemplary only and other parameters may be used in other exemplary embodiments depending on the etching tool used and the liner material. Various etching tools may be used. Dual-damascene opening 32 now substantially includes via section 38 and trench section 42. After antireflective coating 24 is removed, dual damascene opening 32 may be filled with a suitable conductive material and polished to produce the structure in FIG. 1G.

Figure 1G:
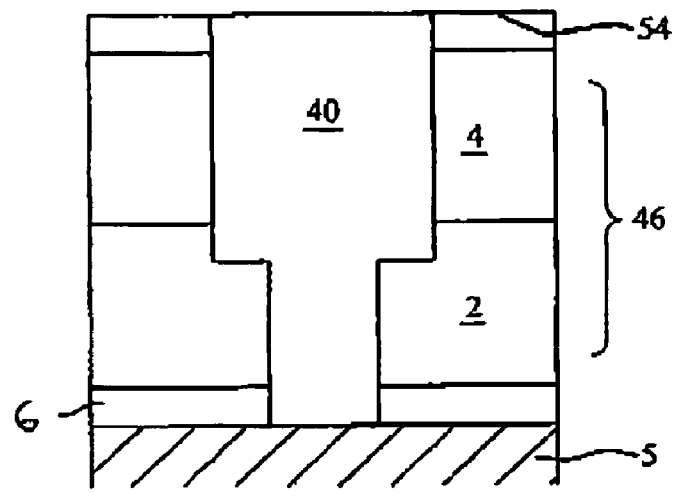

FIG. 1G shows conductive interconnect 40 which may be copper, aluminum, or various alloys thereof, after polishing has been used to produce a substantially planar upper surface 54. The dielectric film stack 46 included in the interconnect structure shown in FIG. 1G includes the advantages of superior mechanical qualities provided by first dielectric layer 2, formed by chemical vapor deposition, and also the superior electrical qualities provided by spin-on coated second dielectric layer 4.

Figure 2A:
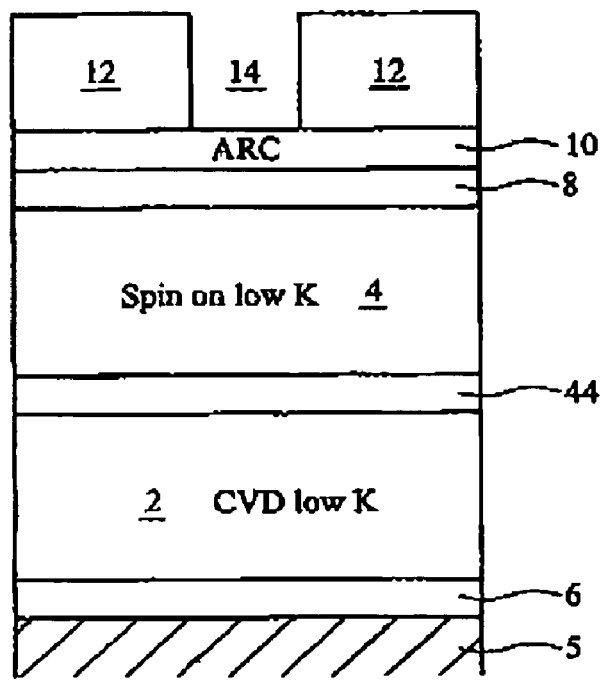
FIGS. 2A–2G show another exemplary process sequence for forming a dual-damascene opening in low-k dielectric materials according to the present invention.

FIGS. 2A–2G are cross-sectional views showing a process sequence for forming a dual-damascene opening according to another exemplary embodiment of the present invention and generally correspond to FIGS. 1A–1G with noted distinctions. FIG. 2A differs from FIG. 1A due to the presence of lower cap layer 44 formed between first dielectric layer 2 and second dielectric layer 4. Lower cap layer 44 may advantageously be a material used to enhance adhesion between the respective dielectric layers and may be formed of SiC, SiN, SiCN, SiOC, SiON or other materials commonly used as cap layers or hard mask layers in the semiconductor manufacturing industry. Conventional formation methods may be used.

Figure 2B:
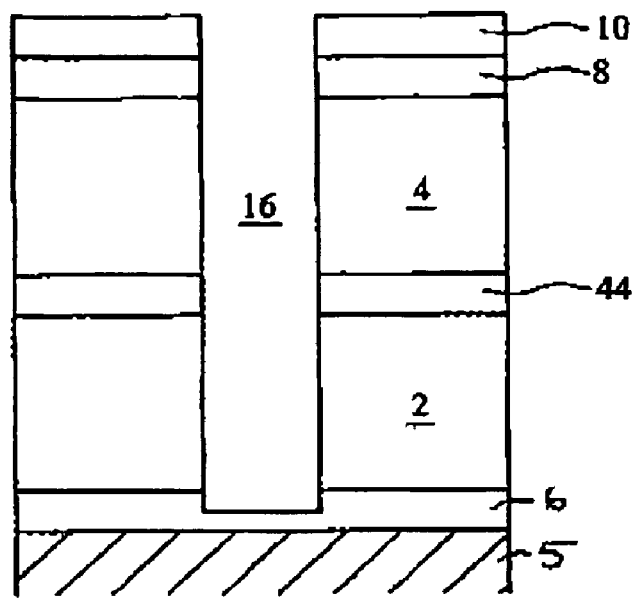

FIG. 2B shows via opening 16 formed to extend through lower cap layer 44 as well as through first dielectric layer 2, second dielectric layer 4, cap layer 8 and antireflective coating 10. First dielectric layer 2 and second dielectric layer 4 are etched using the via etch process as described in conjunction with FIGS. 1A and 1B. Lower cap layer 44 may be etched using a conventional etching operation that may include etch gases CF4, CHF3 O2, N2, and Ar in various combinations. FIG. 2B also illustrates the exemplary embodiment in which anti-reflective coating layer 10 is not removed, but rather remains on the structure after via opening 16 is formed and patterned photoresist layer 12 (shown in FIG. 2A), has been removed.

Figure 2C:
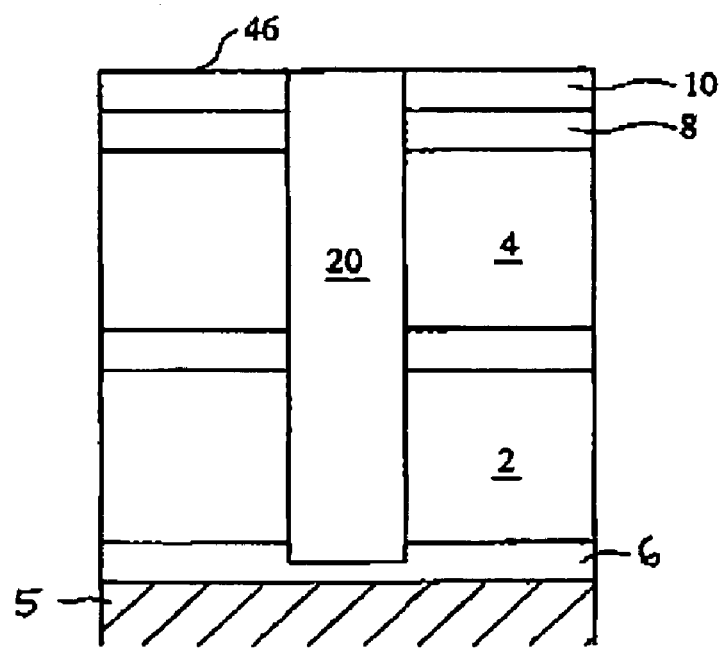
Figure 2D:
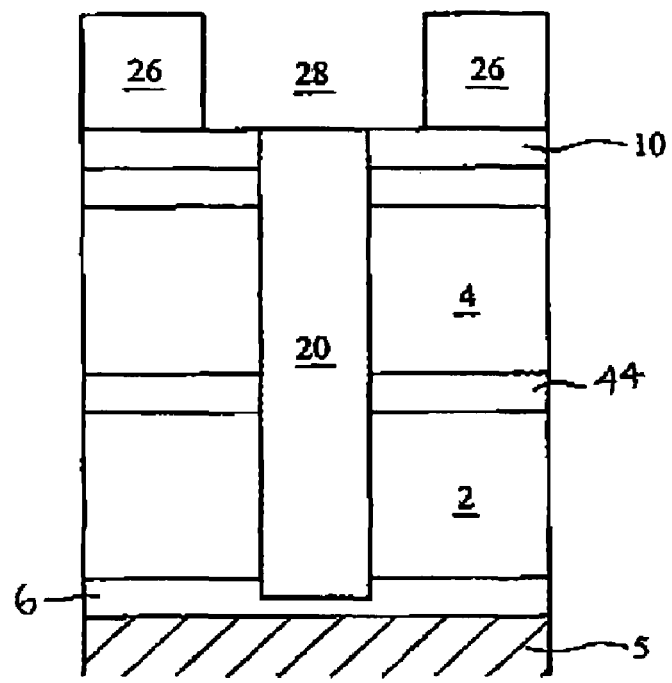

FIG. 2C shows plug material 20 filling via opening 16 and extending up to top surface 46 of antireflective coating 10. FIG. 2D shows opening 28 formed in patterned photoresist layer 26.

Figure 2E:
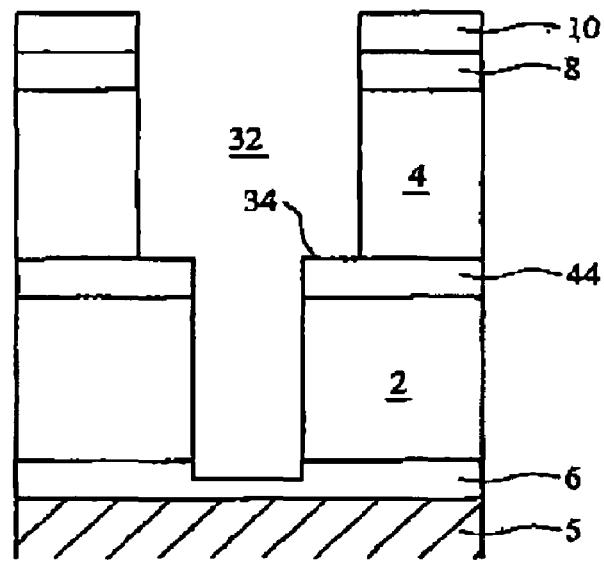

FIG. 2E shows the structure of FIG. 2D after a trench etching operating has been carried out to form dual damascene opening 32. Dual damascene opening 32 is a two tiered opening that includes terraces 34 formed of lower cap layer 44. The trench etch process as described in conjunction with FIGS. 1D–1E may be used to selectively remove the spin-on low-k second dielectric layer 4 and plug material 20, including portions from within the via opening 16 section of first dielectric layer 2, without substantially attacking low-k first dielectric layer 2 which is formed using CVD. Lower cap layer 44 is also resistant to the trench etch process and serves as an etch stop layer in the trench etch process. The trench etch process may include a second dielectric layer: lower cap layer etch selectivity of 20:1 or greater. At least a portion of etch stop layer 6 remains to protect subjacent conductive layer 5 after the trench etch process is concluded.

Figure 2F:
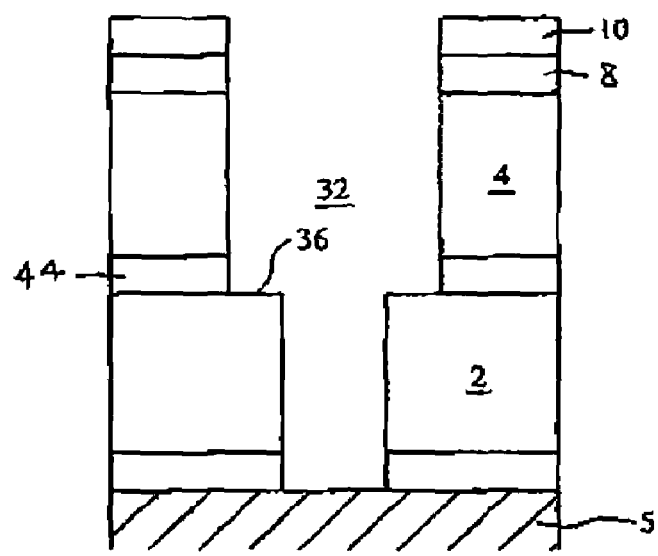
Figure 2G:
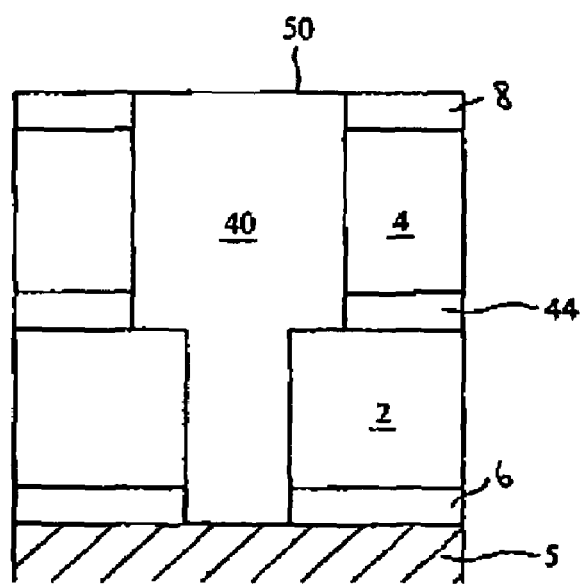

FIG. 2F shows the structure after a liner removal etch has been used to etch exposed portions of etch stop layer 6 and expose subjacent conductive layer 5. Conventional etch processes may be used and will be determined by the materials used to form etch stop layer 6 and lower cap layer 44. An exemplary liner removal etch process is provided in conjunction with FIG. 1F. The liner removal etch further recedes terraces 34 (shown in FIG. 2E) to produce receded terraces 36 within dual damascene opening 32. FIG. 2G shows the structure of FIG. 2F after conductive interconnect 40 has been introduced within dual damascene opening 32 and the structure polished to produce substantially planar upper surface 50.

The preceding merely illustrates the principles of the invention. It will thus be appreciated that those skilled in the art will be able to devise various arrangements which, although not explicitly described or shown herein, embody the principals of the invention and are included within its spirit and scope. Furthermore, all examples and conditional language recited herein are principally intended expressly to be only for pedagogical purposes and to aid the reader in understanding the principals of the invention and the concepts contributed by the inventors to furthering the art, and are to be construed as being without limitation to such specifically recited examples and conditions. Moreover, all statements herein reciting principals, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical,", "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for forming an interconnect structure comprising:
   forming a first dielectric layer over a conductive layer using chemical vapor deposition;
   forming a second dielectric layer over said first dielectric layer by spin coating;
   via etching said second dielectric layer and said first dielectric layer to form a via opening extending through said second dielectric layer and said first dielectric layer;
   filling said via opening with a plug material; and
   trench etching said second dielectric layer and said plug material to form a trench over a lower portion of said via opening and to remove said plug material from said via opening, thereby forming a dual damascene opening.

2. The method as in claim 1, wherein each of said first dielectric layer and said second dielectric layer comprise low-k dielectric materials.

3. The method as in claim 1, wherein said plug material comprises photoresist.

4. The method as in claim 1, wherein said plug material comprises a spin-on low-k dielectric material.

5. The method as in claim 4, wherein said second dielectric layer is a low-k dielectric material that is the same as said spin-on low-k dielectric material.

6. The method as in claim 5, wherein said first dielectric layer and said spin-on low-k dielectric material have different etch rates during said trench etching.

7. The method as in claim 1, wherein said first dielectric layer and said second dielectric layer have different etch rates during said trench etching.

8. The method as in claim 1, wherein said first dielectric layer is substantially resistant to being etched during said trench etching.

9. The method as in claim 1, wherein said first dielectric layer and said second dielectric layer have an etch selectivity no less than 20:1 in said trench etching.

10. The method as in claim 1, wherein said trench etching includes at least one of $H_2$, $N_2$, Ar and $O_2$ as an etch gas.

11. The method as in claim 1, wherein said trench etching includes using only $H_2$, $N_2$, Ar and $O_2$ as etch gases.

12. The method as in claim 1, wherein said filling comprises coating said plug material over said second dielectric layer and filling said via opening, and one of polishing and etching back said plug material.

13. The method as in claim 1, further comprising forming an antireflective coating layer over said plug material and said second dielectric layer after said filling.

14. The method as in claim 1, further comprising forming a further layer over said second dielectric layer prior to said via etching and in which said via etching further comprises etching said further layer, said further layer comprising at least one of a hardmask and an anti-reflective coating.

15. The method as in claim 1, wherein said forming a first dielectric layer over a conductive layer further comprises forming an etch stop layer over said conductive layer and forming said first dielectric layer on said etch stop layer, and further comprising etching said etch stop layer after said trench etching.

16. The method as in claim 1, wherein said first dielectric layer has a dielectric constant no greater than 3.0 and is one of HBD, an oxide and an ultra low-k dielectric material having a dielectric constant less than 2.5.

17. The method as in claim 1, wherein said second dielectric layer has a dielectric constant no greater than 2.6 and is one of SiLK and porous SiLK.

18. The method as in claim 1, further comprising forming a cap layer on said first dielectric layer and in which said forming a second dielectric layer comprises forming said second dielectric layer on said cap layer and said via etch further comprises etching said cap layer.

19. The method as in claim 18, wherein said forming a cap layer comprises forming a layer of one of SiC, SiN, SiCN, SiOC and SiON.

20. The method as in claim 18, wherein said cap layer is substantially resistant to being etched during said trench etching.

* * * * *